United States Patent … Ye et al.

(10) Patent No.: US 12,037,701 B2
(45) Date of Patent: Jul. 16, 2024

(54) MULTI-THERMAL CVD CHAMBERS WITH SHARED GAS DELIVERY AND EXHAUST SYSTEM

(71) Applicant: Applied Materials, Inc., Santa Clara, CA (US)

(72) Inventors: Zhiyuan Ye, San Jose, CA (US); Shu-Kwan Danny Lau, Sunnyvale, CA (US); Brian H. Burrows, San Jose, CA (US); Lori Washington, Union City, CA (US); Herman Diniz, Fremont, CA (US); Martin A. Hilkene, Gilroy, CA (US); Richard O. Collins, Santa Clara, CA (US); Nyi O. Myo, San Jose, CA (US); Manish Hemkar, Sunnyvale, CA (US); Schubert S. Chu, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/218,892

(22) Filed: Mar. 31, 2021

(65) Prior Publication Data
US 2021/0324514 A1    Oct. 21, 2021

Related U.S. Application Data

(60) Provisional application No. 63/012,646, filed on Apr. 20, 2020.

(51) Int. Cl.
*C30B 25/14*    (2006.01)
*C23C 16/44*    (2006.01)
(Continued)

(52) U.S. Cl.
CPC .......... *C30B 25/14* (2013.01); *C23C 16/4412* (2013.01); *C23C 16/455* (2013.01);
(Continued)

(58) Field of Classification Search
CPC .......... C23C 16/4412; C23C 16/45502; C23C 16/45504; C23C 16/45508;
(Continued)

(56) References Cited

U.S. PATENT DOCUMENTS 5,108,792 A * 4/1992 Anderson ............... C30B 25/14
  118/725
6,113,703 A * 9/2000 Anderson ............. C23C 16/455
  118/724
(Continued)

FOREIGN PATENT DOCUMENTS

CN    105164788 A    12/2015
CN    105940480 A    9/2016
(Continued)

OTHER PUBLICATIONS

International Search Report and Written Opinion dated Jul. 21, 2021 for Application No. PCT/US2021/025033.
(Continued)

*Primary Examiner* — Kurt Sweely
(74) *Attorney, Agent, or Firm* — Patterson + Sheridan, LLP

(57) ABSTRACT

A method and apparatus for a process chamber for thermal processing is described herein. The process chamber is a dual process chamber and shares a chamber body. The chamber body includes a first and a second set of gas inject passages. The chamber body may also include a first and a second set of exhaust ports. The process chamber may have a shared gas panel and/or a shared exhaust conduit.

16 Claims, 5 Drawing Sheets

(51) Int. Cl.
*C23C 16/455* (2006.01)
*C30B 25/08* (2006.01)
*C30B 25/10* (2006.01)
*H01L 21/67* (2006.01)

(52) U.S. Cl.
CPC ........ *C30B 25/105* (2013.01); *H01L 21/6719* (2013.01); *C30B 25/08* (2013.01)

(58) Field of Classification Search
CPC ........ C23C 16/45544; C23C 16/45557; C23C 16/45561; C23C 16/45563; C23C 16/45569; C23C 16/4558; C23C 16/4583; C23C 16/4585; C23C 16/481; C23C 16/482; C30B 25/08; C30B 25/10; C30B 25/105; C30B 25/12; C30B 25/14; C30B 25/16; C30B 25/165; H01L 21/67069; H01L 21/67155; H01L 21/67161; H01L 21/6719
See application file for complete search history.

(56) References Cited

U.S. PATENT DOCUMENTS

| | | | |
|---|---|---|---|
| 8,993,444 | B2 | 3/2015 | Chan et al. |
| 9,322,097 | B2 | 4/2016 | Aboagye et al. |
| 9,553,002 | B2 | 1/2017 | Samir et al. |
| 9,695,508 | B2 | 7/2017 | Carlson et al. |
| 9,842,748 | B2 | 12/2017 | Samir et al. |
| 9,856,580 | B2 | 1/2018 | Sanchez et al. |
| 10,170,342 | B2 | 1/2019 | Samir et al. |
| 2003/0124820 | A1* | 7/2003 | Johnsgard ......... C23C 16/45519 118/728 |
| 2005/0133159 | A1 | 6/2005 | Johnsgard et al. |
| 2006/0249175 | A1* | 11/2006 | Nowak ............... C23C 16/4405 134/1 |
| 2006/0251827 | A1* | 11/2006 | Nowak ............... B05D 3/0209 34/275 |
| 2007/0295012 | A1* | 12/2007 | Ho .................... H01L 21/67109 62/56 |
| 2008/0092812 | A1 | 4/2008 | McDiarmid et al. |
| 2012/0156819 | A1 | 6/2012 | Zhu et al. |
| 2012/0240853 | A1* | 9/2012 | Carlson ............. C23C 16/45574 118/715 |
| 2014/0017895 | A1 | 1/2014 | Chan et al. |
| 2014/0261159 | A1 | 9/2014 | Okabe et al. |
| 2014/0322897 | A1 | 10/2014 | Samir et al. |
| 2014/0326185 | A1 | 11/2014 | Lau et al. |
| 2015/0047566 | A1 | 2/2015 | Sanchez et al. |
| 2015/0211114 | A1* | 7/2015 | Kangude ............ C23C 16/4412 118/722 |
| 2015/0267297 | A1 | 9/2015 | Shiba |
| 2017/0125265 | A1 | 5/2017 | Samir et al. |
| 2018/0033652 | A1 | 2/2018 | Samir et al. |

FOREIGN PATENT DOCUMENTS

| | | |
|---|---|---|
| JP | 2007-324286 A | 12/2007 |
| JP | 2014-506396 A | 3/2014 |
| JP | 2015-529011 A | 10/2015 |
| JP | 2016-526279 A | 9/2016 |
| JP | 2017-506821 A | 3/2017 |
| KR | 10-2019-0087046 A | 7/2019 |
| WO | 2005124859 A2 | 12/2005 |
| WO | 2014011364 A1 | 1/2014 |
| WO | 2014179093 A1 | 11/2014 |
| WO | 2015026491 A1 | 2/2015 |
| WO | 2015116370 A1 | 8/2015 |

OTHER PUBLICATIONS

Office Action for Japanese Application No. JP 2022-544048 dated Oct. 3, 2023.
Search Report for Chinese Application No. 202180016018.9 dated Feb. 4, 2024.
Supplementary European Search Report for European Application No. EP 21 79 1907 dated Apr. 29, 2024.

* cited by examiner

MULTI-THERMAL CVD CHAMBERS WITH SHARED GAS DELIVERY AND EXHAUST SYSTEM

CROSS-REFERENCE TO RELATED APPLICATIONS

This application claims priority to U.S. Provisional Patent Application No. 63/012,646, filed Apr. 20, 2020, the entirety of which is herein incorporated by reference.

BACKGROUND

Field

Embodiments described herein generally relate to a dual thermal processing chamber. More specifically, embodiments described herein relate to a dual epitaxial deposition chamber in which two process chambers share one or more of a chamber body, a gas inject panel, or an exhaust channel.

Description of the Related Art

Semiconductor substrates are processed for a wide variety of applications, including the fabrication of integrated devices and microdevices. However, conventional hardware for processing substrates is relatively large requiring the use of more space within a fab. Additionally, conventional hardware suffers from inadequate throughput.

Previous attempts at increasing the amount of substrates capable of simultaneously undergoing epitaxial processing have encountered problems with either temperature control of the surface of the substrate or process gas flow control across the surface of the substrate. Moreover, these conventional attempts are costly and have a large footprint that occupies a large area within a workspace. Therefore, a need exists for an improved thermal process chamber in semiconductor processing.

SUMMARY

The present disclosure generally relates to an apparatus for substrate processing. In one embodiment, the apparatus for substrate processing, includes a dual-chamber body. The dual-chamber body includes a first processing volume on a first side of a central plane and a second processing volume on a second side of a central plane. An equalization port connects the first processing volume and the second processing volume. A first plurality of gas inject passages are formed through the dual-chamber body in fluid communication with the first processing volume and a second plurality of gas inject passages are formed through the dual-chamber body in fluid communication with the second processing volume. A first exhaust port is formed in the dual chamber body opposite the first plurality of gas inject passages. The first exhaust port is in fluid communication with the processing volume. A second exhaust port is formed through the dual-chamber body opposite the second plurality of gas inject passages. The second exhaust port is in fluid communication with the second processing volume. The apparatus further includes one or more upper window assemblies disposed over the dual-chamber body. A first lower window is positioned adjacent the first processing volume and a second lower window is positioned adjacent the second processing volume. A first substrate support is positioned in the first processing volume and a second substrate support is positioned in the second processing volume. A first lower lamp assembly is positioned adjacent the first lower window and a second lower lamp assembly is positioned adjacent the second lower window.

In another embodiment, an apparatus for substrate processing includes a dual-chamber body. The dual-chamber body comprises a first processing volume formed by a first cavity on a first side of a reference plane, a second processing volume formed by a second cavity on a second side of a reference plane, and an equalization port connecting the first processing volume and the second processing volume. A first plurality of gas inject passages is in fluid communication with the first processing volume and a second plurality of gas inject passages is in fluid communication with the second processing volume. A first exhaust port is formed in the dual-chamber body opposite the first plurality of gas inject passages and the first exhaust port is in fluid communication with the processing volume. A second exhaust port is formed in the dual-chamber body opposite the second plurality of gas inject passages and the second exhaust port is in fluid communication with the processing volume. The apparatus for substrate also includes one or more upper window assemblies disposed over the dual-chamber body. A first lower window is positioned adjacent the first processing volume and a second lower window is positioned adjacent the second processing volume. A first substrate support is positioned in the first processing volume and a second substrate support is positioned in the second processing volume. A first lower lamp assembly is positioned adjacent the first lower window and a second lower lamp assembly is positioned adjacent the second lower window.

In yet another embodiment, a dual-chamber body includes a chamber body, a first processing volume formed through the chamber body on a first side of a reference plane and a second processing volume formed through the chamber body on a second side of a reference plane. A first plurality of gas inject passages are in fluid communication with the first processing volume and a second plurality of gas inject passages are in fluid communication with the second processing volume. A first exhaust port is formed in the dual-chamber body opposite the first plurality of gas inject passages, the first exhaust port in fluid communication with the processing volume. A second exhaust port is formed in the dual-chamber body opposite the second plurality of gas inject passages, the second exhaust port in fluid communication with the processing volume. An equalization port connects the first processing volume and the second processing volume.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to apparatus and methods for semiconductor processing, more particularly, to a thermal process system. The thermal processing system is an epitaxial deposition system. The thermal processing system includes a substrate support, one or more upper windows, one or more lower windows, a plurality of upper heating elements, a plurality of lower heating elements, an inner liner, a processing system body, one or more gas panels, and one or more vacuum pumps. In some embodiments, which may be combined with other embodiments the processing system body is a dual body which includes two process chambers formed therein. The two process chambers may share a gas panel and/or an exhaust pump, such as a vacuum pump. A dual body enables the sharing of the gas panel and/or the exhaust pump. By sharing the gas panel and/or the exhaust pump, equipment costs are reduced and the footprint of the system is similarly reduced. More specifically, embodiments described herein relate to a dual body for epitaxial deposition processes.

Figure 1:
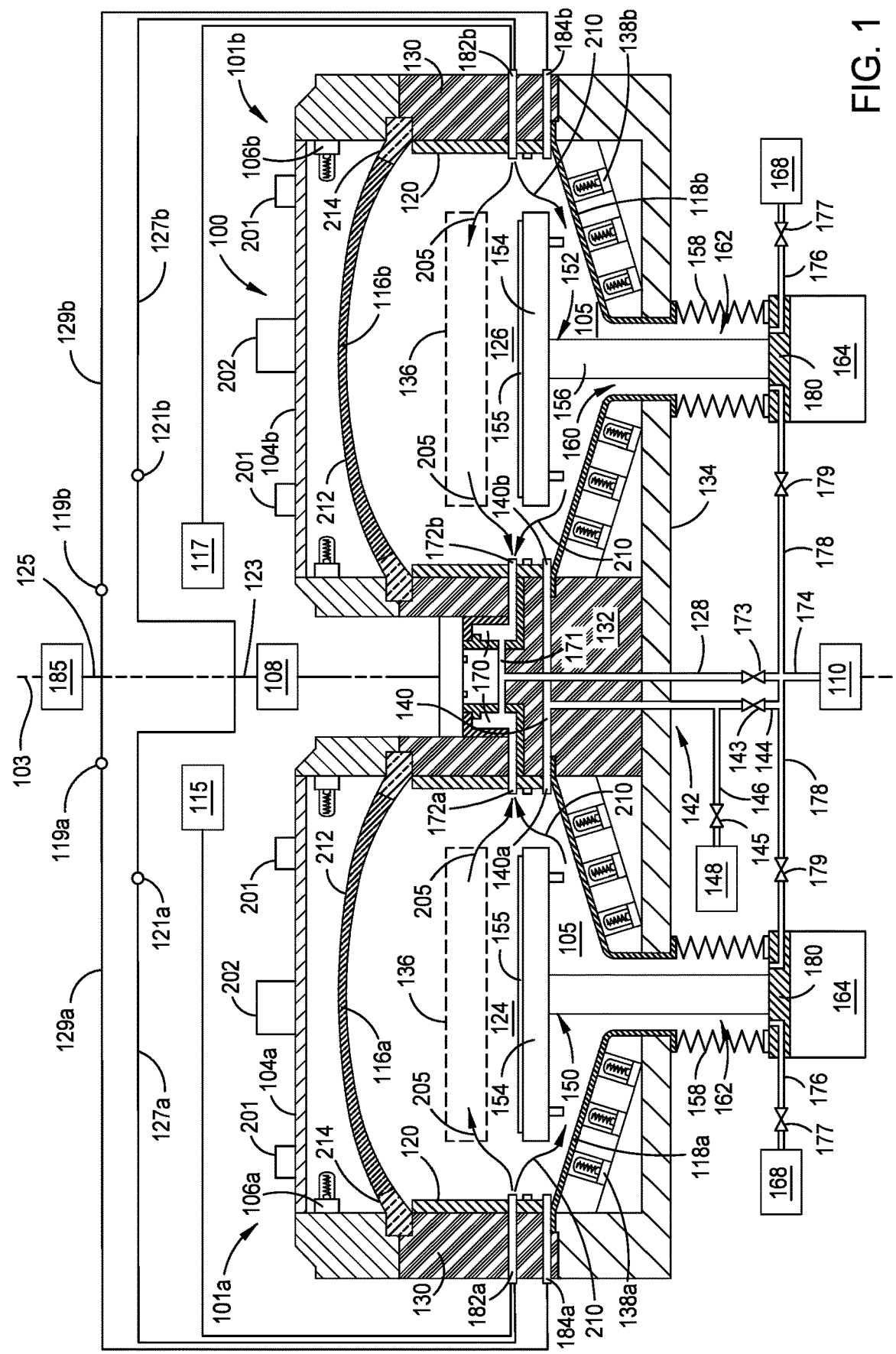
FIG. 1 illustrates a schematic cross-sectional view of a processing system according to one embodiment described herein.

FIG. 1 illustrates a schematic cross-sectional view of a processing system 100 according to one embodiment described herein. The processing system includes a first processing chamber 101a and a second processing chamber 101b. The first processing chamber 101a and the second processing chamber 101b are substantially identical to each other. The processing chambers 101a, 101b share a chamber body 130 and a chamber body bottom 134. The processing chambers 101a, 101b may additionally include a shared lid (not shown). The processing chambers 101a, 101b are mirror images of one another about a central plane 103.

The first processing chamber 101a defines a first processing volume 124 for processing a single substrate. The first processing chamber 101a includes a first upper window 116a, such as a dome, disposed between the first lid 104a and the first processing volume 124. The first processing chamber 101a further includes a first lower window 118a disposed below the first processing volume 124. Above the first upper window 116a there is a plurality of first upper radiant heat sources 106a. The plurality of first upper radiant heat sources 106a are lamps, such as halogen lamps. The first upper radiant heat sources 106a are disposed between the first upper window 116a and the first lid 104a. The first upper radiant heat sources 106a are positioned to provide uniform heating of a substrate 155. Below the first lower window 118a there is a plurality of first lower radiant heat sources 138a. The plurality of first lower radiant heat sources 138a are lamps, such as halogen lamps. The first lower radiant heat sources 138a are disposed between the first lower window 118a and a chamber body bottom 134. The first lower radiant heat sources 138a are positioned to provide uniform heating of a substrate 155.

The second processing chamber 101b defines a second processing volume 126 for processing a single substrate. The second processing chamber 101b includes a second upper window 116b, such as a dome. The second upper window 116b is disposed between the second lid 104b and the second processing volume 126. The second processing chamber 101b further includes a second lower window 118b, such as a dome disposed below the second processing volume 126. Above the second upper window 116b there may be a plurality of second upper radiant heat sources 106b. The plurality of second upper radiant heat sources 106b are lamps, such as halogen lamps. The second upper radiant heat sources 106b are disposed between the second upper window 116b and the second lid 104b. The second upper radiant heat sources 106b are positioned to provide predetermined heating of the second upper window 116b. Below the second lower window 118b there is a plurality of second lower radiant heat sources 138b. The plurality of second lower radiant heat sources 138b are lamps, such as halogen lamps. The second lower radiant heat sources 138b are disposed between the second lower window 118b and a chamber body bottom 134. The second lower radiant heat sources 138b are positioned to provide predetermined heating of the second lower window 118b.

Figure 2:
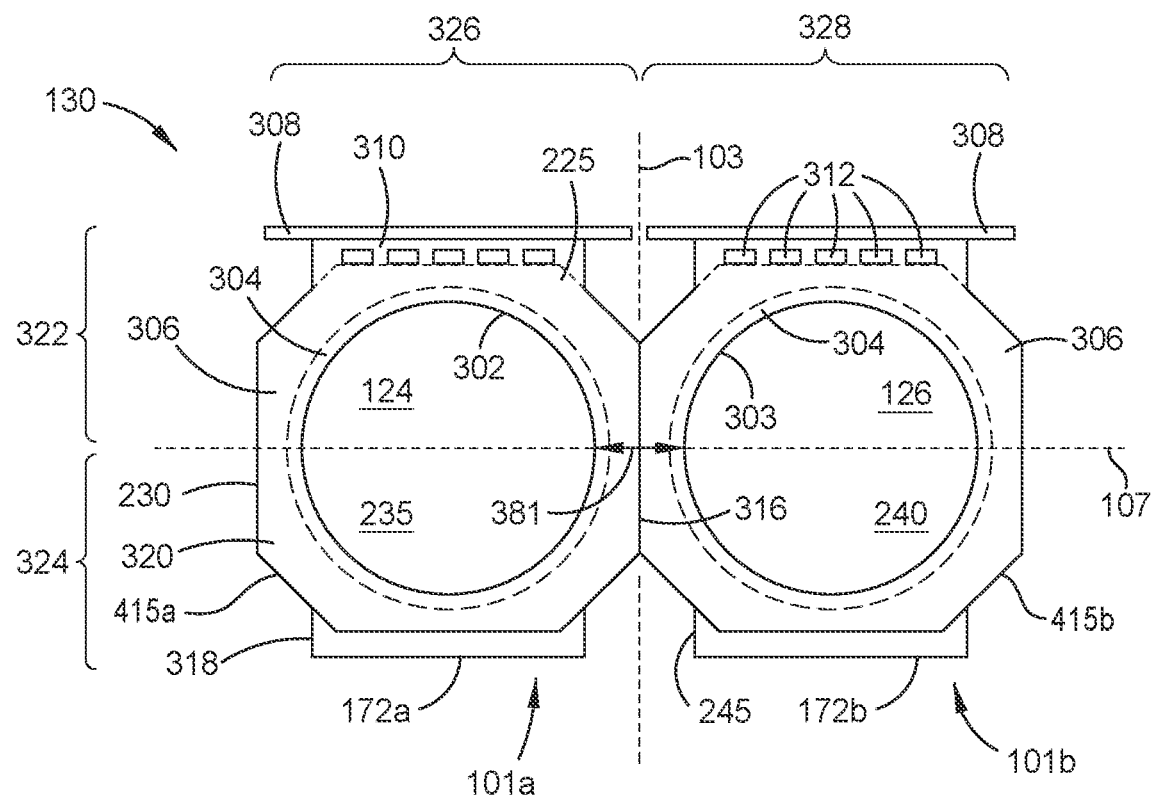
FIG. 2 illustrates a plan view of the chamber body of the processing system of FIG. 1.
Figure 3:
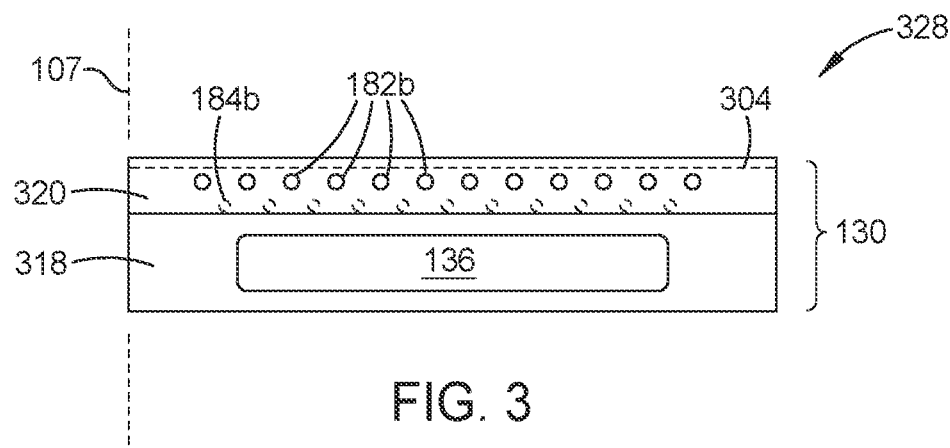
FIG. 3 illustrates a partial cross-sectional side view of part of the chamber body of FIG. 2.

The first and second upper windows 116a, 116b and the first and second lower windows 118a, 118b may be transparent to the infrared radiation, defined as transmitting at least 95% of infrared radiation. In some embodiments, the first and second upper windows 116a, 116b and the first and second lower windows 118a, 118b may be a quartz material. In some embodiments, the first and second upper windows 116a, 116b include an inner window 212 and outer window supports 214. The inner window 212 may be a thin quartz window and partially defines the processing volumes 124, 126. The outer window supports 214 support the inner window 212 and are at least partially disposed within a support groove 304 (FIGS. 2 and 3).

In some embodiments, the first and second upper windows 116a, 116b may be a single window, such that there is a single upper window assembly 600 (FIG. 6) disposed above both the first processing chamber 101a and the second processing chamber 101b. The single upper window assembly 600 may assist in eliminating pressure gradients across the first and second processing chambers 101a, 101b and reduce temperature gradients across a single upper window 616. The single upper window 616 additionally eliminates the need for a center wall, such as the center wall 132. The single upper window 616 is described in greater detail in FIG. 6 and the accompanying text.

The processing system 100 also includes pedestal assemblies 150 and 152, which are disposed in the first and second processing chambers 101a, 101b, respectively. Liners 120 are disposed within each of the first and second processing chambers 101a, 101b and surround each of the pedestal assemblies 150, 152. The pedestal assembly 150 is disposed at least partially within the first processing chamber 101a and the pedestal assembly 152 is disposed at least partially within the second processing chamber 101b. A liner 120 shields a chamber body 130 from processing chemistry in the first and second processing volumes 124, 126. Each of the first and second processing chambers 101a, 101b include a liner 120. The chamber body 130 is disposed between the upper window 116 and the lower window 118. The liner 120 is disposed in the first and second processing chambers 101a and 101b. The each of the liners 120 are disposed between one of the processing volumes 124, 126 and the chamber body 130. An exhaust plenum 170 partially surrounds the processing volumes 124, 126 and one or more exhaust ports 172a, 172b are formed through the liners 120 connecting the exhaust plenum 170 and the processing volumes 124, 126.

The first and second processing chambers 101a, 101b share a gas panel 108 and a vacuum pump 110. The gas panel 108 may be two individual gas panels or a shared gas panel. Both of the first and the second processing chambers 101a, 101b are provided with gas by the same gas panel 108 when a shared gas panel 108 is utilized. The gas panel 108 provides process gasses to the first and second processing volumes 124, 126 through the conduit 123 and the first and second gas inject passages 182a, 182b. The gas panel 108 distributed gas evenly between the first processing volume 124 and the second processing volume 126. The gas panel 108 connects to a conduit 123. The conduit 123 splits into two additional conduits 127a, 127b. The conduit 123 may include a split controller. The split controller is disposed between the conduit 123 and the conduits 127a, 127b. The split controller controls the flow of gases to each of the conduits 127a, 127b. In some embodiments, the split controller includes a valve or mass flow controller. The two additional conduits 127a, 127b distribute gas from the conduit 123 to the first and second gas inject passages 182a, 182b respectively. The conduits 127a, 127b have restrictors 121a, 121b disposed therein. The restrictors 121a, 121b control the flow of the process gasses through the conduits 127a, 127b. The restrictors 121a, 121b may additionally measure the flow of the process gasses through the conduits 127a, 127b. The restrictors 121a, 121b control the flow of the process gasses that are flowing from the gas panel 108 and balance the process gas flow, so that the process gas flow is the same in both of the conduits 127a, 127b. The restrictors 121a, 121b, may be, for example, valves, mass flow controllers, or other restriction devices. The restrictors 121a, 121b may be used in addition to or in place of the precise split controller (not shown) coupled to the conduit 123. Gases that can be supplied by the gas panel 108 include process gases such as purge gases, cleaning gases, and deposition gases.

The first and second processing chambers 101a, 101b further include a first individual gas panel 115 and a second individual gas panel 117. The first individual gas panel 115 provides process gasses to the first processing volume 124 through the first gas inject passages 182a. The second individual gas panel 117 provides process gasses to the second processing volume 126 through the second gas inject passages 182b. The first and second individual gas panels 115, 117 are utilized if the restrictors 121a, 121b are unable to properly balance the process gas flow from the shared gas panel 108 or if a supplemental gas is used for a particular process. Gases that may be supplied by the first and second individual gas panels 115, 117 include deposition gases and carrier gases.

In some embodiments, both the shared gas panel 108 and the first and second individual gas panels 115, 117 are utilized. In other embodiments, only the shared gas panel 108 is utilized. In yet other embodiments, both the first and the second individual gas panels 115, 117 are utilized. In embodiments in which as least some process gases are supplied by the shared gas panel 108, the cost of the gas injection system may be decreased.

The first processing chamber 101a is coupled to the gas panel 108 via a first gas inject passage 182a. The first gas inject passage 182a is in fluid communication with the first processing volume 124, such that the first gas inject passage 182a provides process gas to the first processing volume 124 from the gas panel 108.

Process gas supplied from the gas panel 108 is introduced into the first processing volume 124 through the first gas inject passage 182a formed in the sidewall of the chamber body 130, such that the gas panel 108 is a process gas panel. The first gas inject passage 182a is configured to direct the process gas in a generally radially inward direction towards the pedestal assembly 150. As such, in some embodiments, the first gas inject passage 182a may be a cross-flow gas injector. The cross-flow gas injector is positioned to direct the process gas across a surface of a substrate 155 and/or the supporting surface 154. During a film formation process, the supporting surface 154 is located in the processing position, which is adjacent to and at about the same elevation as the first gas inject passage 182a, thus allowing the process gas to flow generally along flow path 205 across the upper surface of the substrate 155 and/or the supporting surface 154. The process gas exits the first processing volume 124 through the first exhaust ports 172a located on the opposite side of the first processing volume 124 as the first gas inject passage 182a. Removal of the process gas through the first exhaust ports 172a may be facilitated by the vacuum pump 110.

The gas panel 108 is attached to a second gas inject passage 182b. The second gas inject passage 182b is in fluid communication with the second processing volume 126, such that the second gas inject passage 182b provides process gas to the second processing volume 126 from the gas panel 108.

Process gas supplied from the gas panel 108 is introduced into the second processing volume 126 through the second gas inject passage 182b formed in the sidewall of the chamber body 130. The second gas inject passage 182b is configured to direct the process gas in a generally radially inward direction. As such, in some embodiments, the second gas inject passage 182b may be a cross-flow gas injector. The cross-flow gas injector is positioned to direct the process gas across a surface of a substrate 155 and/or the supporting surface 154. During a film formation process, the supporting surface 154 is located in the processing position, which is adjacent to and at about the same elevation as the second gas inject passage 182b, thus allowing the process gas to flow generally along flow path 205 across the upper surface of the substrate 155 and/or the supporting surface 154. The process gas exits the second processing volume 126 through the second exhaust ports 172b located on the opposite side of the first processing volume 126 as the second gas inject passage 182b. Removal of the process gas through the second exhaust ports 172b may be facilitated by the vacuum pump 110.

Purge gas supplied from a purge gas source 185 is introduced to the bottom regions 105 of the both the first and second processing volumes 124, 126 through first and second purge gas inlets 184a, 184b formed in the sidewall of the chamber body 130.

The purge gas source 185 is in fluid communication with a conduit 125. The conduit 125 transfers the purge gas from the purge gas source 185. The conduit 125 splits into two additional conduits 129a, 129b. The conduits 129a, 129b connect the conduit 125 to the first and second purge gas inlets 184a, 184b. The purge gas source 185 is in fluid communication with the first and second purge gas inlets 184a, 184b through the conduit 125 and the conduits 129a, 129b. The first purge gas inlets 184a is in fluid communication with the conduit 129a and the second purge gas inlets 184b are in fluid communication with the conduit 129b. The purge gas flow through the conduits 129a, 129b is balanced using the first and second purge gas restrictors 119a, 119b. The first and second purge gas restrictors 119a, 119b balance the flow so that the flow through each of the conduits 129a, 129b is the same.

The first purge gas inlet 184a is disposed at an elevation below the first gas inject passage 182a. If the liner 120 is used, the liner 120 may be disposed between the first gas inject passage 182a and the first purge gas inlet 184a. In either case, the first purge gas inlet 184a is configured to direct the purge gas in a generally radially inward direction. The first purge gas inlet 184a may be configured to direct the purge gas in an upward direction. During a film formation process, the pedestal assembly 152 is located at a position such that the purge gas flows generally along a flow path 210 across a back side of the supporting surfaces 154. The purge gas exits the bottom region 105 and is exhausted out of the process chamber through the first exhaust port 172a located on the opposite side of the first processing volume 101a as the first purge gas inlet 184a.

The second purge gas inlet 184b is disposed at an elevation below the second gas inject passage 182b. If the liner 120 is used, a section of the liner 120 may be disposed between the second gas inject passage 182b and the second purge gas inlet 184b. In either case, the second purge gas inlet 184b is configured to direct the purge gas in a generally radially inward direction. The second purge gas inlet 184b may be configured to direct the purge gas in an upward direction. During a film formation process, the pedestal assembly 152 is located at a position such that the purge gas flows generally along a flow path 210 across a back side of the supporting surfaces 154. The purge gas exits the bottom region 105 and is exhausted out of the process chamber through the second exhaust port 172b located on the opposite side of the second processing volume 101b as the second purge gas inlet 184b.

A vacuum pump 110 is in fluid communication with the exhaust plenum 170 so that the processing volumes 124, 126 can be pumped out through the plurality of exhaust ports 172a, 172b and the exhaust plenum 170. The exhaust plenum 170 is coupled to a common exhaust conduit 171. The common exhaust conduit 171 connects to an exhaust outlet pipe 128, which extends through the chamber body bottom 134 to a pump conduit 174. The pump conduit 174 is coupled to the vacuum pump 110 to facilitate the pumping of gases from the common exhaust conduit 171. A common exhaust valve 173 is disposed on the pump conduit 174 between the common exhaust conduit 171 and the vacuum pump 110. The common exhaust valve 173 may be opened or closed depending on desired pumping operation.

The supporting surfaces 154 of the pedestal assemblies 150, 152 are disposed within the processing volumes 124, 126. The supporting surfaces 154 are generally a top portion of the pedestal assemblies 150, 152 configured to support a substrate during processing. A bottom region 105 of the chambers 101a, 101b is defined between the chamber body bottom 134 and the supporting surfaces 154 of the pedestal assemblies 150, 152. Each pedestal assembly 150, 152 has a stem 156 that extends from a bottom surface of each pedestal assembly 150, 152 through a bottom 134 of the chamber body 130. The stems 156 are coupled to a respective motor 164, which is configured to independently raise, lower, and/or rotate each of the pedestal assemblies 150, 152.

Pedestal bellows ports 160 are formed in the bottom 134 of the chamber body 130. The pedestal bellows ports 160 extend through the bottom 134 of the chamber body 130. Each pedestal bellows port 160 has a diameter larger than a diameter of the stem 156 and circumscribes each stem 156 where the stem 156 extends through the bottom 134 of the chamber body 130. The pedestal bellows ports 160 circumferentially surround the stems 156.

A bellows assembly 158 is disposed around each pedestal bellows port 160 to prevent vacuum leakage outside the chamber body 130. Each of the bellows assemblies 158 circumscribe and enclose a portion of one of the stems 156 disposed outside the chamber body 130. The bellows assemblies 158 are coupled between an exterior surface of the bottom 134 of the chamber body 130 and a base member 180. The base member 180 may house the motor 164 and a portion of the stem 156, which is coupled to the motor 164.

The bellows assemblies 158 may be formed from a metallic or metallized material and be configured to form a gas flow channel 162. The gas flow channel 162 is defined as a region between the stem 156 and the bellows assembly 158. The gas flow channel 162 extends from the pedestal bellows port 160 to the base member 180. As such, the gas flow channel 162 forms a hollow cylindrically shaped passage between the bellows assembly 158 and the stem 156. The gas flow channel 162 is fluidly coupled between the bottom region 105 and an exhaust conduit 178. The exhaust conduit 178 extends from the gas flow channel 162 through the base member 180 to the pump conduit 174. A valve 179 is disposed on the exhaust conduit 178 between the gas flow channel 162 and the pump conduit 174. When the valve 179 is closed, pumping via the exhaust plenum 170 may proceed and when the valve 179 is open, pumping via the pedestal bellows port 160 may proceed. When the valve 179 is open, the common exhaust valve 173 may be closed to enhance pumping of the bottom region 105 via the pedestal bellows port 160.

In one embodiment of a pumping process, the bottom regions 105 of each chamber 101a, 101b are pumped via the pedestal bellows port 160. Gases and particles present in the bottom region 105 travel through the pedestal bellows port 160, the gas flow channel 162 and the exhaust conduit 178 to the vacuum pump 110. In this embodiment, the common exhaust valve 173 is closed and the valve 179 is open so that the pump is in fluid communication with the bottom region 105. The pumping via the pedestal bellows port 160 is performed during a chamber cleaning process, for example, when the chamber is idle and not processing a substrate. An inert gas may also be provided to the chambers 101a, 101b during the pedestal bellows pumping process. For example, argon is provided to both chambers 101a, 101b from one of the gas panel 108 or the purge gas source 185 for each chamber 101a, 101b. It is believed that the argon provided via the gas panel 108 or purge gas source 185 enables more efficient cleaning and pumping of the bottom region 105.

In one embodiment, a gas source 168 is fluidly coupled to each of the bottom regions 105 via the gas flow channel 162 and the pedestal bellows port 160. The gas source 168 may be configured to deliver an inert gas or a cleaning gas to the bottom region 105. Although schematically shown as being in close physical proximity with the system 100, the gas source 168 is generally a remote gas source located remotely from the system 100. The gas source 168 is coupled to a conduit 176, which extends from the gas source 168 through the base member 180. The conduit 176 is in fluid communication with the gas flow channel 162. A valve 177 is disposed on the conduit 176 between the gas source 168 and the base member 180.

In one embodiment, an inert gas, or purge gas, is provided to the bottom region 105. In operation, the purge gas is provided to the bottom region 105 along a flow pathway from the gas source 168, through the conduit 176 with the valve 177 opened, the gas flow channel 162 and the pedestal bellows port 160. The purge gas is provided from the gas source 168 during processing of a substrate in the chambers 101a, 101b. Suitable purge gases include inert gases, such as helium, neon and argon. However, other unreactive gases may also be utilized.

It is believed that flowing the purge gas during processing of a substrate prevents particles and contaminants from falling below the supporting surface 154 and depositing on surfaces of the chambers 101a, 101b which define the bottom region 105. During purging via the pedestal bellows port 160, pumping of the chambers 101a, 101b proceeds via the exhaust plenum 170 and the vacuum pump 110. The plurality of exhaust ports 172 and at least a portion of the exhaust plenum 170 are substantially coplanar with the supporting surface 154. Pumping via the exhaust plenum 170 draws the purge gas from the bottom region 105. In this embodiment, the purge gas and contaminants are exhausted from the chambers 101a, 101b without the contaminants falling below the supporting surface 154. It is contemplated, however, that pumping and purging through the bellows assembly 158 may be omitted. In such an example, the corresponding hardware for pumping and purging through the bellows assembly 158 may also be omitted.

The system 100 also includes an equalization port 140 which is disposed through a center wall 132 of the system. The center wall 132 divides the chambers 101a, 101b and defines at least a portion of the bottom region 105. The equalization port 140 includes a first opening 140a in fluid communication with the bottom region 105 of the first process chamber 101a. The equalization port 140 further includes a second opening 140b in fluid communication with the bottom region 105 of the second process chamber 101b. Each of the first opening 140a and the second opening 140b are disposed on opposite sides of the equalization port 140 and in fluid communication with each other. The equalization port 140 may be formed in the center wall 132 or through a region of the chamber body 130 defining the bottom region 105. The equalization port 140 is disposed below the supporting surface 154 and the exhaust plenum 170. The equalization port 140 extends from the bottom region 105 of each chamber 101a, 101b through the center wall 132 and enables the bottom region 105 of each chamber 101a, 101b to be in fluid communication with one another.

A conduit 144 extends from the equalization port 140 through the center wall 132 and exits the bottom 134 of the chamber body 130 at an exit port 142. The conduit 144 fluidly couples the equalization port 140 with the exhaust conduit 178. A valve 143 is disposed on the conduit 144 between the exit port 142 and the exhaust conduit 178. Thus, when the valve 143 is open, the bottom region 105 is in fluid communication with the vacuum pump 110.

In one example, the bottom region 105 is exhausted by an equalization port 140 pumping process. The equalization port 140 pumping process is performed while the chamber is idle, such as during an idle cleaning process. To enable pumping via the equalization port 140, the exhaust valve 173 is closed and the valve 143 is opened. As such, the vacuum pump 110 is in fluid communication with the bottom region 105 via the conduit 144 and the equalization port 140. As a result of the exhaust valve 173 being closed, exhausting of the chambers 101a, 101b proceeds via the equalization port 140 and not through the exhaust plenum 170.

During the equalization port 140 pumping process, the vacuum pump 110 exhausts gases and contaminants from the bottom region 105 through the equalization port 140 and conduit 144. An inert gas may also be provided to the chambers 101a, 101b during the equalization port 140 pumping process. For example, argon is provided to both chambers 101a, 101b from the gas panel 108. It is believed that the argon provided via the gas panel 108 enables more efficient cleaning and pumping of the bottom region 105. Pumping via the equalization port 140 removes undesirable contaminants from the bottom region 105 without utilizing the exhaust plenum 170, which provides increased functionality of the system 100.

The equalization port 140 additionally equalizes the pressure between each of the chambers 101a, 101b during substrate processing. Equalizing the pressures within the chambers 101a, 101b allows for more consistent deposition results between the processed substrates within each of the chambers 101a, 101b.

In one embodiment, a gas source 148 is fluidly coupled to the bottom regions 105 via the conduit 144 and the equalization port 140. The gas source 148 may be configured to deliver an inert gas or a cleaning gas to the bottom regions 105. Although schematically shown as being in close physical proximity with the system 100, the gas source 148 is generally a remote gas source located remotely from the system 100. The gas source 148 is coupled to a conduit 146 which extends from the gas source 148 to the conduit 144. A valve 145 is disposed on the conduit 146 between the gas source 148 and the conduit 144.

In one embodiment, an inert gas, or purge gas, is provided to the bottom regions 105. In operation, the purge gas is provided to the bottom regions 105 along a flow pathway from the gas source 148, through the conduit 146 with the valve 145 opened, the conduit 144, and the equalization port 140. The purge gas is provided from the gas source 148 during an idle cleaning process. Suitable purge gases include inert gases, such as helium, neon and argon. However, other unreactive gases may also be utilized An opening 136 is formed through each of the first and second processing chambers 101a, 101b. The opening 136 may be used to transfer the substrate in and out of the first and second processing volumes 124, 126. In some embodiments, the opening 136 is a slit valve. In other embodiments, the opening 136 may be connected to any suitable valve that enables the passage of a substrate 155 therethrough.

In one embodiment, each of the first and second processing chambers 101a, 101b may also include one or more temperature sensors 201, such as optical pyrometers, which measure temperatures within the first and second processing chambers 101a, 101b and on the surface of the substrate 155. The one or more temperature sensors 201 are disposed on the first and second lids 104a, 104b. One or more high-energy radiant source assemblies 202, such as focused high-energy radiant source assemblies, for example laser source assemblies, may be disposed on the first and second lids 104a, 104b. The one or more high-energy radiant source assemblies 202 may produce one or more high-energy radiant beams in order to perform localized heating of the substrate 155. The one or more high-energy radiant source assemblies 202 may be one or more spot heater assemblies.

FIG. 2 illustrates a plan view of the chamber body 130 of the processing system of FIG. 1. The chamber body 130 includes two body sections 415a, 415b, two interface surfaces 308, two inlet sections 310, an upper ring assembly 320, a lower ring assembly 318, and a first and second exhaust port 172a, 172b. The chamber body 130 encloses both the first and second processing chambers 101a, 101b.

Each of the first processing chamber 101a and the second processing chamber 101b (shown in FIG. 1) form a first half 326 and a second half 328 of the chamber body 130. The first half 326 of the chamber body 130 defines a first body section 415a. The second half 328 of the chamber body 130 defines a second body section 415b. The first and second halves 326, 328 of the chamber body 130 are be disposed on opposite sides of the central plane 103. The central plane 103 bisects the chamber body 130, such that the first half 326 of the chamber body 130 is a mirror image of the second half 328 of the chamber body 130.

The upper ring assembly 320 is the upper portion of the chamber body 130. The upper ring assembly 320 at least partially encloses the first processing volume 124 and the second processing volume 126. The upper ring assembly 320 may be a continuous body with a single piece, or may be multiple components fastened together. In embodiments in which the upper ring assembly 320 is a continuous body, the upper ring assembly 320 is described as a monolithic upper assembly. Utilizing a monolithic assembly for the upper ring assembly 320 ensures that each of the first and second processing chambers 101a, 101b are disposed in the same vertical position. Using a monolithic upper ring assembly 320 also ensures that the equalization port 140 brings both of the first and second processing volumes 124, 126 into fluid communication with one another without having to manage potential misalignment or broken seals between the first and second body sections 415a, 415b. The upper ring assembly 320 includes an inlet section 310, gas passages 312, a first cavity 235, a second cavity 240, a first cavity wall 302, and a second cavity wall 303. The first cavity wall 302 of the first cavity 235 is the outer wall of the first cavity 235. The second cavity wall 303 of the second cavity 240 is the outer wall of the second cavity 240.

Each of the first half 326 and the second half 328 include an interface surface 308. The interface surface 308 includes the opening 136 used to transfer the substrate 155 into and out of the first and second processing chambers 101a, 101b. The interface surface 308 may be connected to another set of process chambers, a factory interface, or transfer chambers (not shown). The interface surface 308 is a flanged surface disposed from the first and second processing chambers 101a, 101b.

Each of the first half 326 and the second half 328 further include an inlet section 310. The inlet section 310 is a part of the upper ring assembly 320. The inlet section 310 is the section of the upper ring assembly 320 in which the gas passages 312 are formed. The inlet section 310 may be a continuous portion of the upper ring assembly 320, or may be separable from the upper ring assembly 320. The inlet section 310 extends outward from a sidewall 225 of the upper ring assembly 320. The sidewall 225 is part of the outer surface 230 of the upper ring assembly 320.

The gas passages 312 are in fluid communication with the gas panel 108 and the purge gas source 185. The gas passages 312 may be a plurality of individual gas passages 312. Each of the plurality of gas passages 312 is used to flow one or more process gases into the first and second processing volumes 124, 126 through the first and second inject passages 182a, 182b. In one exemplary embodiment, which may be combined with other embodiments, the gas passages 312 are formed through the inlet section 310 of the first and the second body sections 415a, 415b. The gas passages 312 are fluidly connected to the first inject passages 182a. The first inject passages 182a are in fluid communication with the first processing volume 124. In this embodiment, there are additional gas passages 312 formed through the inlet section of the second body section 415b. The gas passages 312 formed through the inlet section 310 of the second body section 415b are fluidly connected to the second inject passages 182b. The second inject passages 182b are in fluid communication with the second processing volume 126. The gas passages 312 may include a plurality of gas passages 312, such as four or more gas passages 312, five or more gas passages 312, six or more gas passages 312, eight or more gas passages 312, 10 or more gas passages 312, or 12 or more gas passages 312.

A lower ring assembly 318 is disposed below the upper ring assembly 320. The lower ring assembly 318 is the lower portion of the chamber body 130 (shown in FIG. 1). The lower ring assembly 318 at least partially encloses the first processing volume 124 and the second processing volume 126. The lower ring assembly 318 may be a continuous body with a single piece, or may be multiple components fastened together. In embodiments in which the lower ring assembly 318 is a continuous body, the lower ring assembly 318 may be described as a monolithic lower ring assembly. Utilizing a monolithic lower ring assembly for the lower ring assembly 318 ensures that each of the first and second processing chambers 101a, 101b are disposed in the same vertical position. Using a monolithic lower ring assembly 318 also ensures that the equalization port 140 brings both of the first and second processing volumes 124, 126 into fluid communication with one another without having to manage potential misalignment or broken seals between the first and second processing chambers 101a, 101b. The lower ring assembly 318 includes the first and second exhaust ports 172a, 172b, a first cavity 235, a second cavity 240, a first cavity wall 302, and a second cavity wall 303. The first cavity wall 302 of the first cavity 235 is the outer wall of the first cavity 235. The second cavity wall 303 of the second cavity 240 is the outer wall of the second cavity 240. The equalization port 140 is disposed between each of the first and second processing chambers 101a, 101b through the lower ring assembly 318. Alternatively, the equalization port 140 is disposed through the upper ring assembly 320.

The first and second exhaust ports 172a, 172b may be disposed on the opposite side (e.g., about 180 degrees) of the chamber body 130 as the first and second inject passages 182a, 182b to facilitate a cross flow regime. The first and second exhaust ports 172a, 172b may be formed in the lower ring assembly 318 and therefore are disposed vertically below the first and second gas inject passages 182a, 182b. The first exhaust ports 172a are disposed opposite the first inject passages 182a and the second exhaust ports 172b are disposed opposite the second inject passages 182b. The positioning of the first exhaust ports 172a allows for gas coming from the first inject passage 182a to flow horizontally within the first processing volume 124. The positioning of the second exhaust ports 172b allows for gas coming from the second inject passage 182b to flow horizontally within the second processing volume 126. The first and second exhaust ports 172a, 172b extend from the first and second cavity walls 302, 303 to an outer surface 245 of the lower ring assembly 318.

The support groove 304 is disposed within each of the first and second body sections 415a, 415b adjacent to the first and second cavity walls 302, 303. The support groove 304 is a lip that extends around the diameter of the first and second cavity walls 302, 303. The support groove 304 may be shaped to receive and support an edge of the first and second upper windows 116a, 116b (shown in FIG. 1). The support groove 304 may be a groove that is vertically offset from and lower than the rest of a top surface 306 of the upper ring assembly 320.

In some embodiments, the chamber body 130 is separated into a first side 322 and a second side 324. The first side 322 and the second side 324 are on opposite sides of a reference plane 107. The reference plane is a longitudinal axis of the chamber body 130. The reference plane 107 is normal to the central plane 103. The reference plane 107 divides the chamber body 130, such that the first side 322 of the chamber body 130 is on one side of the reference plane 107 and the second side 324 of the chamber body 130 is on the opposite side of the reference plane 107 as the first side 322. The first body section 415a is the first side 322 of the chamber body 130 and the second body section 415b is the second side 324 of the chamber body 130. In one exemplary embodiment, the interface surface 308, the inlet section 310 and the gas passages 312 are all in the first side 322 while the first and second exhaust ports 172a, 172b are in the second side 324. In other embodiments, the interface surface 308 is in the first side and the inlet section 310, the gas passages 312, and the first and second exhaust ports 172a, 172b are split between the first and second side 322, 324.

The first cavity 235 and the second cavity 240 are separated by a minimum distance 381. The minimum distance 381 is the minimum distance between the first cavity wall 302 and the second cavity wall 303. The minimum distance may be the minimum width of the center wall 132. Depending upon the embodiment utilized, the minimum distance 381 varies, such that the center wall 132 varies in thickness. In embodiments in which the first and the second upper windows 116a, 116b are separated, the minimum distance 381 is greater than zero millimeters, such as greater than one millimeter thick. In embodiments in which the first and the second upper windows 116a, 116b are replaced with a single upper window 616 (FIG. 6), the minimum distance 381 may be negligible, such that the minimum distance 381 is zero millimeters thick and the center wall 132 has an opening formed therethrough. In this embodiment, the equalization port 140 may not be formed through the center wall 132. In some embodiments, when the minimum distance 381 is reduced to zero millimeters and the minimum width of the center wall 132 is zero millimeters, the first cavity 235 and the second cavity 240 are still separated by either a gas curtain, or a section of the liner 120 disposed between the first cavity 235 and the second cavity 240.

FIG. 3 illustrates a cross-sectional side view of part of the chamber body 130 of FIG. 2. The part of the chamber body 130 shown in FIG. 3 is the second half 328 of the chamber body 130. The first half 326 is similar to the second half 328. The second purge gas inlet 184b, the second gas inject passages 182b, the support groove 304, and the opening 136 of the second processing chamber 101b may also represent the first purge gas inlet 184a, the first gas inject 182a, the support groove 304, and the opening 136 of the first side and the first processing chamber 101a. The chamber body 130 includes the upper ring assembly 320 and the lower ring assembly 318.

FIG. 3 shows the relationship between the first and second gas inject passages 182a, 182b, the first and second purge gas inlets 184a, 184b, and the opening 136. The first and second gas inject passages 182a, 182b and the first and second purge gas inlets 184a, 184b are disposed in the upper ring assembly 320. The first and second gas inject passages 182a, 182b are disposed above the first and second purge gas inlets 184a, 184b. In some embodiments there may be at least 4 of each of the first and second gas inject passages 182a, 182b, such as 5 or more first and second gas inject passages 182a, 182b, such as 6 or more of the first and second gas inject passages 182a, 182b, such as 8 or more of the first and second gas inject passages 182a, 182b, such as 10 or more of each of the first and second gas inject passages 182a, 182b, such as 12 or more of each of the first and second gas inject passages 182a, 182b. In similar embodiments, there may be at least 4 of each of the first and second purge gas inlets 184a, 184b, such as 5 or more of the first and second purge gas inlets 184a, 184b, such as 6 or more of the first and second purge gas inlets 184a, 184b, such as 8 or more of the first and second purge gas inlets 184a, 184b, such as 10 or more of the first and second purge gas inlets 184a, 184b, such as 12 or more of each of the first and second purge gas inlets 184a, 184b. Each of the first and second gas inject passages 182a, 182b and the first and second purge gas inlets 184a, 184b are parallel to one another. The first and second gas inject passages 182a, 182b as well as the first and second purge gas inlets 184a, 184b are spaced along the inner wall of the first and second processing chambers 101a, 101b.

Figure 4A:
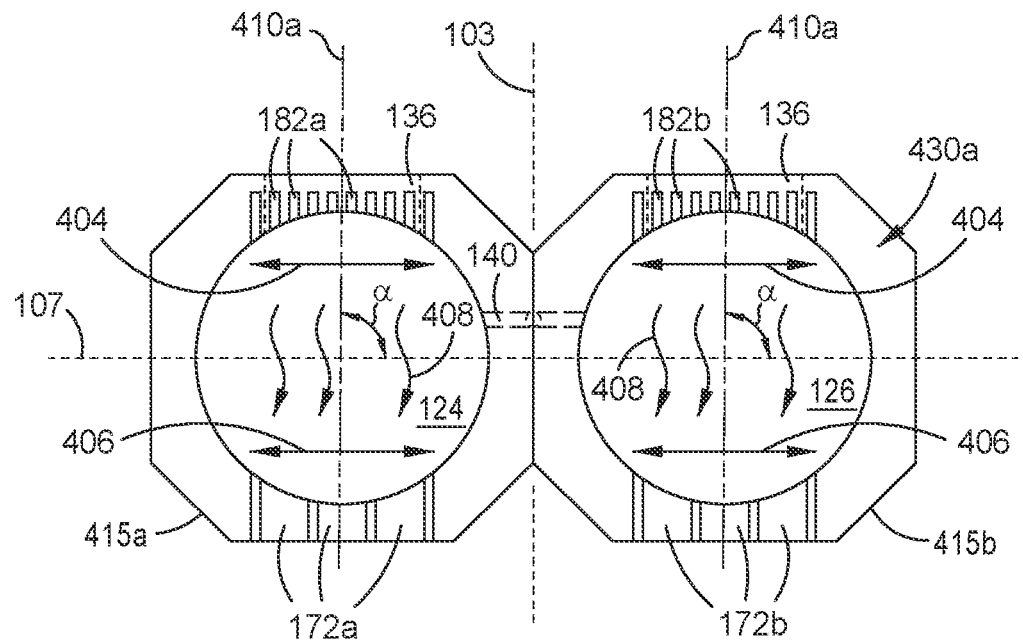
FIG. 4A illustrates a cross-sectional plan view of the chamber body of FIG. 2 according to a first embodiment described herein.

The opening 136 is below the second gas inject passages 182b and the second purge gas inlets 184b. As described previously with reference to FIG. 1, the opening 136 is sized and positioned to allow a substrate 155 to pass therethrough. The opening 136 may be capable of being closed using a valve. In some embodiments, the opening 136 is disposed directly underneath the second gas inject passages 182b and the second purge gas inlets 184b. Alternatively, the opening 136 is disposed adjacent to, but angularly offset from the second gas inject passages 182b and the second purge gas inlets 184b. Embodiments in which the opening 136 would be in a position alternative to that shown in FIG. 3 are described in FIGS. 4B-4D and the accompanying descriptions. The support groove 304 is above the second gas inject passages 182b and the second purge gas inlets 184b. The first and second exhaust ports 172a, 172b are disposed across from the first and second gas inject passages 182a, 182b as shown in FIG. 4A. The first and the second exhaust ports 172a, 172b include a plurality of exhaust ports, such that there are at least two exhaust ports, such as three or more exhaust ports, such as four or more exhaust ports, such as five or more exhaust ports in each of the first and the second exhaust ports 172a, 172b.

FIG. 4A illustrates a cross-sectional plan view of a chamber body 430a, similar to the chamber body 130 of FIG. 2 according to a first embodiment described herein. The cross-sectional view of the chamber body 430a illustrates the relationship between the opening 136, the first and second gas inject passages 182a, 182b and the first and second exhaust ports 172a, 172b. The chamber body 430a of FIG. 4A also includes the equalization port 140.

The gas inject chord length 404 is the chord length from a gas inject passage on one end of either the first or the second gas inject passages 182a, 182b to a gas inject passage on the opposite end of either the first or the second gas inject passages 182a, 182b. The gas inject passages used to define the gas inject chord length 404 are the gas inject passages on opposite extremes of the first and the second gas inject passages 182a, 182b. The gas inject chord length 404 as described herein is less than 500 mm, such as less than 450 mm, such as less than 400 mm. The gas inject chord length 404 is greater than 150 mm, such as greater than 200 mm. The gas inject chord length 404 is configured to allow flow of a process gas over the entire surface of a substrate.

The exhaust port chord length 406 is the chord length from an outer edge of exhaust port on one end of either the first or the second exhaust ports 172a, 172b to an edge of an exhaust port on the opposite end of either the first or the second exhaust ports 172a, 172b. The exhaust ports used to define the exhaust port chord length 406 are the exhaust ports on opposite extremes of the first and the second exhaust ports 172a, 172b. The exhaust port chord length 406 is less than 500 mm, such as less than 450 mm, such as less than 400 mm. The exhaust port chord length 406 is greater than 150 mm, such as greater than 200 mm.

The gas inject chord length 404 may be similar to the exhaust port chord length 406. In some embodiments, the gas inject chord length 404 may be less than about 10 percent smaller or larger than the exhaust port chord length 406, such as less than about 5 percent smaller or larger or less than 1 percent smaller or larger.

In the embodiment of FIG. 4A, all of the first and second gas inject passages 182a, 182b, the first and second purge gas inlets 184a, 184b, and the first and second exhaust ports 172a, 172b are positioned parallel to one another. The openings 136 in the chamber body 430a are at a position parallel to all of the first and second gas inject passages 182a, 182b, the first and second purge gas inlets 184a, 184b, and the first and second exhaust ports 172a, 172b. The opening 136 of the first body section 415a is disposed directly below the first gas inject passages 182a. The opening 136 of the second body section 415b is disposed directly below the second gas inject passages 182b.

The equalization port 140 is disposed between the first and second body sections 415a, 415b. The equalization port 140 connects the first and second processing volumes 124, 126 to each other.

A process gas flow path 408 of process gases crosses the first processing volume 124 and travels from either the first gas inject passages 182a or the first purge gas inlets 184a (shown in FIG. 1) to the first exhaust ports 172a. The process gas flow path 408 also crosses the second processing volume 126 and travels from either the second gas inject passages 182b or the second purge gas inlets 184b (shown in FIG. 1) to the second exhaust ports 172b. Although illustrated in FIG. 4A as a curved line, the process gas flow path 408 is preferably a straight line and flows across the substrate 155 within each of the first and second processing volumes 124, 126.

Each of first and second gas inject passages 182a, 182b and the first and second exhaust ports 172a, 172b are bisected by a first flow path plane 410a. One of the first flow path planes 410a extends through both the first body section 415a and the second body section 415b. The first flow path planes 410a are parallel to the flow of the process gases from the first and second gas inject passages 182a, 182b to the first and second exhaust ports 172a, 172b. The first flow path planes 410a are normal to the reference plane 107 (e.g., normal to a longitudinal axis of the chamber body 430) and therefore form an angle α of 90 degrees between the first flow path plane 410a and the reference plane 107. However, it is contemplated that the angle α may deviate from 90 degrees, such that the first flow path plane 410a and the reference plane 107 are not normal. In some exemplary embodiments, the angle α is about 80 degrees to about 100 degrees, such as about 85 degrees to about 95 degrees.

The embodiment of FIG. 4A enables for a shared gas panel, such as the gas panel 108, and a shared exhaust, such as the common exhaust conduit 171, to be utilized (See FIG. 1). The use of a shared gas panel and shared exhaust reduces the cost of the system, but still enables for high accuracy of heating and process gas flow within the first and second processing volumes 124, 126. The orientation of the first and second gas inject passages 182a, 182b, the first and second purge gas inlets 184a, 184b, and the first and second exhaust ports 172a, 172b provides space for the utilization of shared gas panels and shared exhaust panels.

Figure 4B:
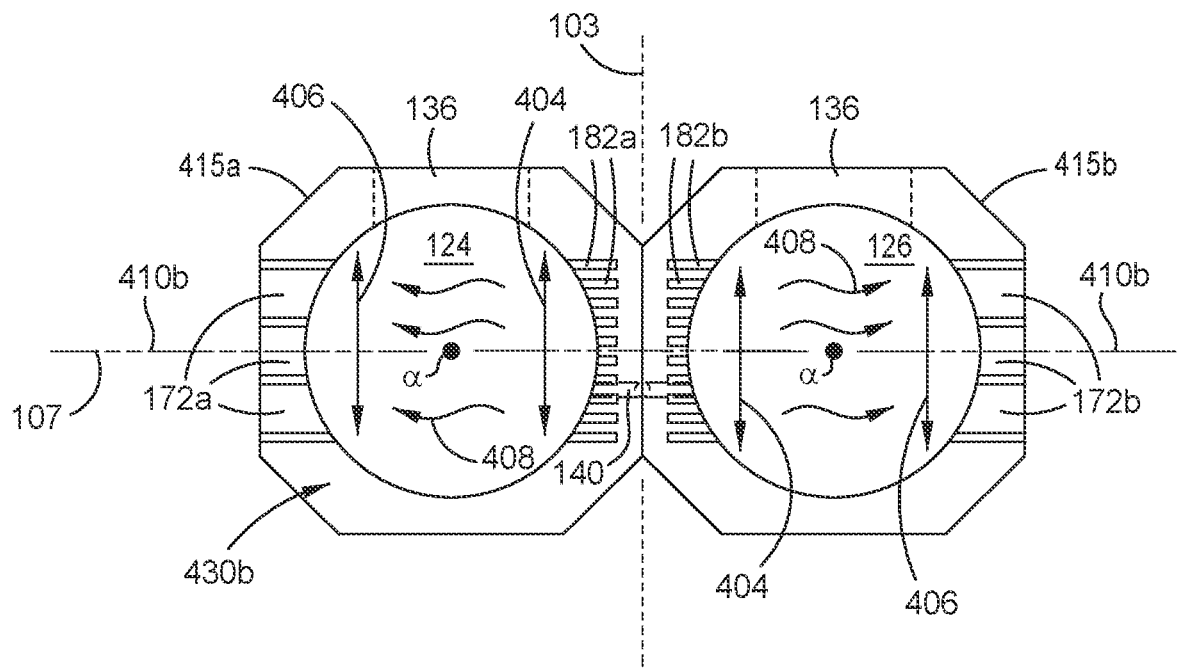
FIG. 4B illustrates a cross-sectional plan view of the chamber body of FIG. 2 according to a second embodiment described herein.

FIG. 4B illustrates a cross-sectional plan view of a chamber body 430b, which can replace the chamber body 130 of FIG. 2 according to a second embodiment described herein. In the second embodiment described in FIG. 4B, the first and second gas inject passages 182a, 182b, the first and second purge gas inlets 184a, 184b, and the first and second exhaust ports 172a, 172b are positioned parallel to the reference plane 107. The cross-sectional view of the chamber body 430b illustrates the relationship between the opening 136, the first and second gas inject passages 182a, 182b and the first and second exhaust ports 172a, 172b. The chamber body 430b of FIG. 4A also includes the equalization port 140.

In the exemplary embodiment of FIG. 4B, all of the first and second gas inject passages 182a, 182b, the first and second purge gas inlets 184a, 184b, and the first and second exhaust ports 172a, 172b are positioned parallel and in line with one another (e.g., parallel to a longitudinal axis of the chamber body 430). The openings 136 in both the first and second body sections 415a, 415b are at a position perpendicular to all of the first and second gas inject passages 182a, 182b, the first and second purge gas inlets 184a, 184b, and the first and second exhaust ports 172a, 172b. The opening 136 of the first processing chamber 101a is between the positions of the first gas inject passages 182a and the first exhaust ports 172a. The opening 136 of the second processing chamber 101b is between the positions of the second gas inject passages 182b and the second exhaust ports 172b.

The equalization port 140 is disposed between the first and second body sections 415a, 415b. In the embodiment described in FIG. 4B, the equalization port 140 is in line with the first and second gas inject passages 182a, 182b. The equalization port 140 is beneath the first and second gas inject passages 182a, 182b and connects the first and second processing volumes 124, 126 to each other.

The gas inject chord length 404 and the exhaust port chord length 406 of FIG. 4B are defined in the same way as the gas inject chord length 404 and the exhaust port chord length 406 of FIG. 4A. The process gas flow path 408 of FIG. 4B is also defined in the same way as the process gas flow path 408 of FIG. 4A. In the embodiment disclosed in FIG. 4B, the process gas flow paths 408 are diverging from the center wall 132 of the chamber body 430 and moving towards the outer edges of the chamber body 430. The process gas flowing from the first gas inject passage 182a flows towards the first exhaust port 172a and the process gas flowing from the second gas inject passage 182b flows towards the second exhaust port 172b.

As in FIG. 4A, both the first and second gas inject passages 182a, 182b and the first and second exhaust ports 172a, 172b are bisected by a second flow path plane 410b. The second flow path planes 410b extend through the first body section 415a and the second body section 415b. In the embodiment of FIG. 4B, the second flow path planes 410b are co-planar or form a single plane through the chamber body 430. The second flow path plane 410b is parallel to the flow of the process gases from the first and second gas inject passages 182a, 182b to the first and second exhaust ports 172a, 172b. In the embodiment of FIG. 4B, the second flow path plane 410b is parallel to the reference plane 107. The second flow path plane 410b and the reference plane 107 form an angle α. In the embodiment described in FIG. 4B, the angle α is about 0 degrees. In some exemplary embodiments, the angle α deviates from 0 degrees and is about −10 degrees to about 10 degrees, such as about −5 degrees to about 5 degrees.

The embodiment of FIG. 4B enables for a shared gas panel, such as the gas panel 108, and a shared exhaust, such as the common exhaust conduit 171, to be utilized. The use of a shared gas panel and shared exhaust reduces the cost of the system, but still enables for high accuracy of heating and process gas flow within the first and second processing volumes 124, 126. A shared gas panel 108 may be particularly beneficial in the embodiment of FIG. 4B as the first and second gas inject passages 182a, 182b are relatively close together.

Figure 4C:
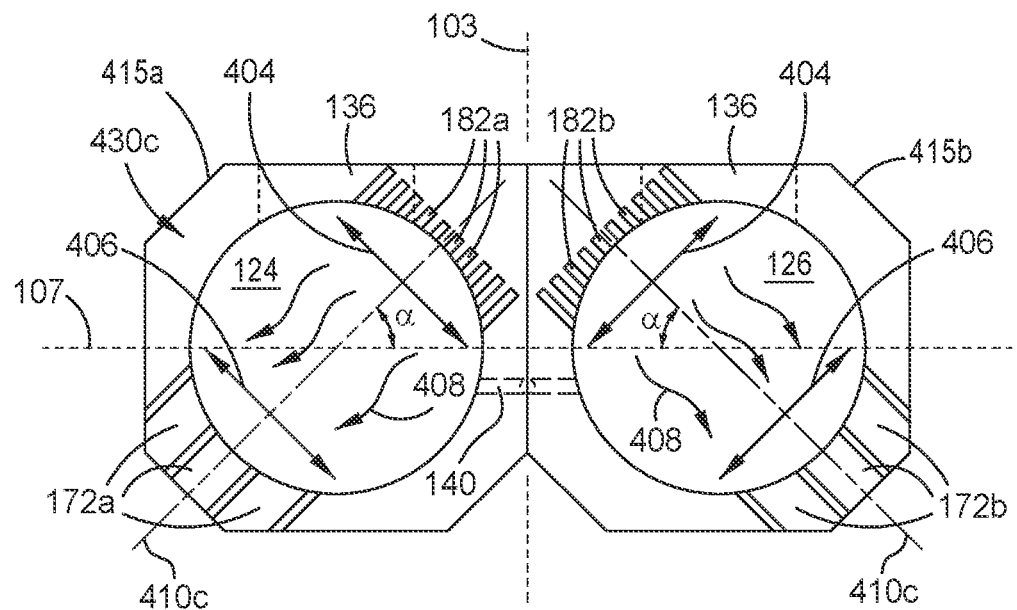
FIG. 4C illustrates a cross-sectional plan view of the chamber body of FIG. 2 according to a third embodiment described herein.

FIG. 4C illustrates a cross-sectional plan view of the chamber body 130 of FIG. 2 according to a third embodiment described herein. In the third embodiment described herein and in FIG. 4C the chamber body 130 of FIG. 2 is replaced with the chamber body 430c of FIG. 4C. In the chamber body 430c, the first and second gas inject passages 182a, 182b, the first and second purge gas inlets 184a, 184b, and the first and second exhaust ports 172a, 172b are positioned at an acute angle α to the reference plane 107 (e.g., the longitudinal axis of chamber body 430). The cross-sectional view of the chamber body 430c illustrates the relationship between the opening 136, the first and second gas inject passages 182a, 182b and the first and second exhaust ports 172a, 172b. The chamber body 430c of FIG. 4C also includes the equalization port 140.

In the exemplary embodiment of FIG. 4C, all of the first gas inject passages 182a, the first purge gas inlets 184a, and the first exhaust ports 172a are positioned parallel and in line with one another along a third flow path plane 410c. The second gas inject passages 182b, the second purge gas inlets 184b, and the second exhaust ports 172b are also positioned parallel and in line with one another along another third flow path plane 410c. The openings 136 in both the first and second body sections 415a, 415b are at an angle with all of the first and second gas inject passages 182a, 182b, the first and second purge gas inlets 184a, 184b, and the first and second exhaust ports 172a, 172b. The opening 136 of the first body section 415a is adjacent to and disposed partially below the first gas inject passages 182a and the first exhaust ports 172a. The opening 136 is only partially disposed below the first gas inject passages 182a and the first purge gas inlets 184a. The opening 136 of the second body section 415b is adjacent to and disposed partially below the second gas inject passages 182b and the second exhaust ports 172b. The opening 136 is only partially disposed below the second gas inject passages 182b and the second purge gas inlets 184b.

The equalization port 140 is disposed between the first and second body sections 415a, 415b. In the embodiment described in FIG. 4C, the equalization port 140 connects the first and second processing volumes 124, 126 to each other.

The gas inject chord length 404 and the exhaust port chord length 406 of FIG. 4C are defined in the same way as the gas inject chord length 404 and the exhaust port chord length 406 of FIG. 4A and FIG. 4B. The process gas flow path 408 of FIG. 4C is also defined in the same way as the process gas flow path 408 of FIG. 4A and FIG. 4B. In the embodiment disclosed in FIG. 4C, the process gas flow paths 408 travel at an angle to the central plane 103 and the reference plane 107 of the chamber body 430c and moving towards the outer edges of the chamber body 430c. The process gas flowing from the first gas inject passage 182a flows towards the first exhaust port 172a and the process gas flowing from the second gas inject passage 182b flows towards the second exhaust port 172b.

As in FIGS. 4A and 4B, the first and second gas inject passages 182a, 182b and the first and second exhaust ports 172a, 172b are bisected by third flow path planes 410c. The third flow path planes 410c extend through the first body section 415a and the second body section 415b. Each of the third flow path planes 410c are parallel to the flow of the process gases from one of the first or the second gas inject passages 182a, 182b to one of the first or the second exhaust ports 172a, 172b. In the exemplary embodiment of FIG. 4C, each of third flow path planes 410c are at an acute angle α with the reference plane 107 when the angle α is facing (e.g., oriented) inward towards the central plane 103. The angle α is the angle on the inside of the second flow path plane 410c and closer to the opening 136. In the embodiment described in FIG. 4C and the accompanying text, the angle α is about 45 degrees. In some exemplary embodiments, the angle α is about 10 degrees to about 80 degrees, such as about 20 degrees to about 70 degrees, such as about 30 degrees to about 60 degrees, such as about 35 degrees to about 55 degrees, such as about 40 degrees to about 50 degrees.

In the embodiment described in FIG. 4C, a shared gas panel, such as the gas panel 108 may be more easily utilized to provide process gas to the first and second processing chambers 101a, 101b. The first and second gas inject passages 182a, 182b are close to one another and therefore shorter gas conduits can be utilized to transfer the process gasses from the gas panel 108 to the first and second gas inject passages 182a, 182b. Having shorter gas conduits saves on cost and the pressure may be more equally distributed (allowing improved gas flow uniformity) between the first and second processing chambers 101a, 101b without variable conduit lengths and back pressures. The exhaust system for the embodiment of FIG. 4C may include separate exhaust systems for each of the first processing chamber 101a and the second processing chamber 101b. In some embodiments, a shared exhaust system, such as the common exhaust conduit 171 may also be utilized in this embodiment. The shared gas panel and separate exhaust systems reduces the difficulty of servicing the lamp head and other chamber components.

Figure 4D:
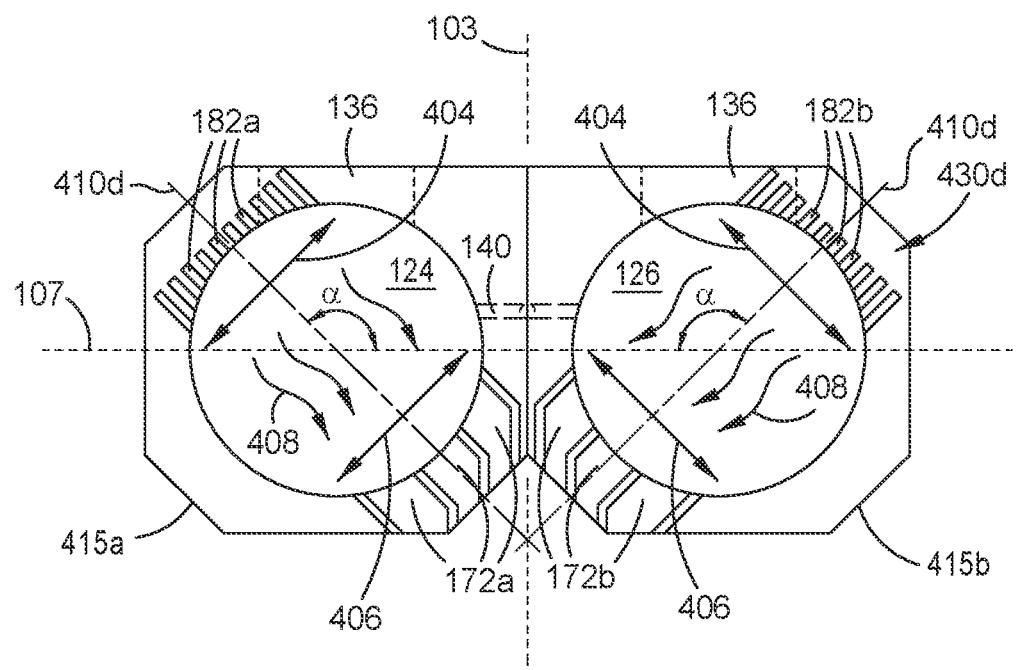
FIG. 4D illustrates a cross-sectional plan view of the chamber body of FIG. 2 according to a fourth embodiment described herein.

FIG. 4D illustrates a cross-sectional plan view of the chamber body 130 of FIG. 2 according to a fourth embodiment described herein. In the fourth embodiment described herein and in FIG. 4D, the chamber body 130 is replaced with the chamber body 430d. In the chamber body 430d, the first and second gas inject passages 182a, 182b, the first and second purge gas inlets 184a, 184b, and the first and second exhaust ports 172a, 172b are positioned at an obtuse angle α to the reference plane 107 (e.g., obtuse to a longitudinal axis of the chamber body 430). The cross-sectional view of the chamber body 430d illustrates the relationship between the opening 136, the first and second gas inject passages 182a, 182b and the first and second exhaust ports 172a, 172b. The chamber body 430d of FIG. 4A also includes the equalization port 140.

In the exemplary embodiment of FIG. 4D, all of the first gas inject passages 182a, the first purge gas inlets 184a, and the first exhaust ports 172a are positioned parallel and in line with one another along a fourth flow path plane 410d. The second gas inject passages 182b, the second purge gas inlets 184b, and the second exhaust ports 172b are also positioned parallel and in line with one another along another fourth flow path plane 410d. The openings 136 in both the first and second body sections 415a, 415b are at an angle with all of the first and second gas inject passages 182a, 182b, the first and second purge gas inlets 184a, 184b, and the first and second exhaust ports 172a, 172b. The opening 136 of the first processing chamber 101a is adjacent to and disposed partially below the first gas inject passages 182a and the first exhaust ports 172a. The opening 136 is only partially disposed below the first gas inject passages 182a and the first purge gas inlets 184a. The opening 136 of the second processing chamber 101b is adjacent to and disposed partially below the second gas inject passages 182b and the second exhaust ports 172b. The opening 136 is only partially disposed below the second gas inject passages 182b and the second purge gas inlets 184b.

The equalization port 140 is disposed between the first and second body sections 415a, 415b. In the embodiment described in FIG. 4D, the equalization port 140 connects the first and second processing volumes 124, 126 to each other.

The gas inject chord length 404 and the exhaust port chord length 406 of FIG. 4D are defined in the same way as the gas inject chord length 404 and the exhaust port chord length 406 of FIGS. 4A-4C. The process gas flow path 408 of FIG. 4D is also defined in the same way as the process gas flow path 408 of FIGS. 4A-4C. In the embodiment disclosed in FIG. 4D, the process gas flow paths 408 travel at an angle α to the central plane 103 and the reference plane 107 of the chamber body 430d and moving towards the center wall 132 of the chamber body 430d. The process gas flowing from the first gas inject passage 182a flows towards the first exhaust port 172a and the process gas flowing from the second gas inject passage 182b flows towards the second exhaust port 172b.

As in FIGS. 4A-4C, each of the first and second gas inject passages 182a, 182b and the first and second exhaust ports 172a, 172b are bisected by fourth flow path planes 410d. One fourth flow path planes 410d extend through each of the first body section 415a and the second body section 415b. The fourth flow path planes 410d are parallel to the flow of the process gases from the first and second gas inject passages 182a, 182b to the first and second exhaust ports 172a, 172b. In the exemplary embodiment of FIG. 4D, the fourth flow path planes 410d are disposed at an obtuse angle α with the reference plane 107, when the angle is taken as an inside angle towards the central plane 103. The angle α is the angle on the inside of the second flow path plane 410b and closer to the opening 136. In the embodiment described in FIG. 4C, the angle α is about 135 degrees. In some exemplary embodiments, the angle α is about 100 degrees to about 170 degrees, such as about 110 degrees to about 160 degrees, such as about 120 degrees to about 150 degrees, such as about 125 degrees to about 145 degrees, such as about 130 degrees to about 140 degrees.

In the embodiment described in FIG. 4D, a common exhaust conduit 171 may be more easily utilized to remove process gas from the first and second processing chambers 101a, 101b. The first and second exhaust ports 172a, 172b are close to one another and therefore shorter gas conduits are utilized to transfer the exhaust gasses from the first and second processing volumes 124, 126 to the vacuum pump 110. In embodiments in which the chamber body 430d is a monolithic body, the first and second exhaust ports 172a, 172b may merge into a single exhaust. Having short gas conduits and a single exhaust reduces chamber costs. The use of a single vacuum pump 110 further saves on equipment cost. The use of a common exhaust conduit 171 simplifies the maintenance of the exhaust, which reducing the total downtime of the processing chambers when cleaning the exhaust systems.

Figure 5:
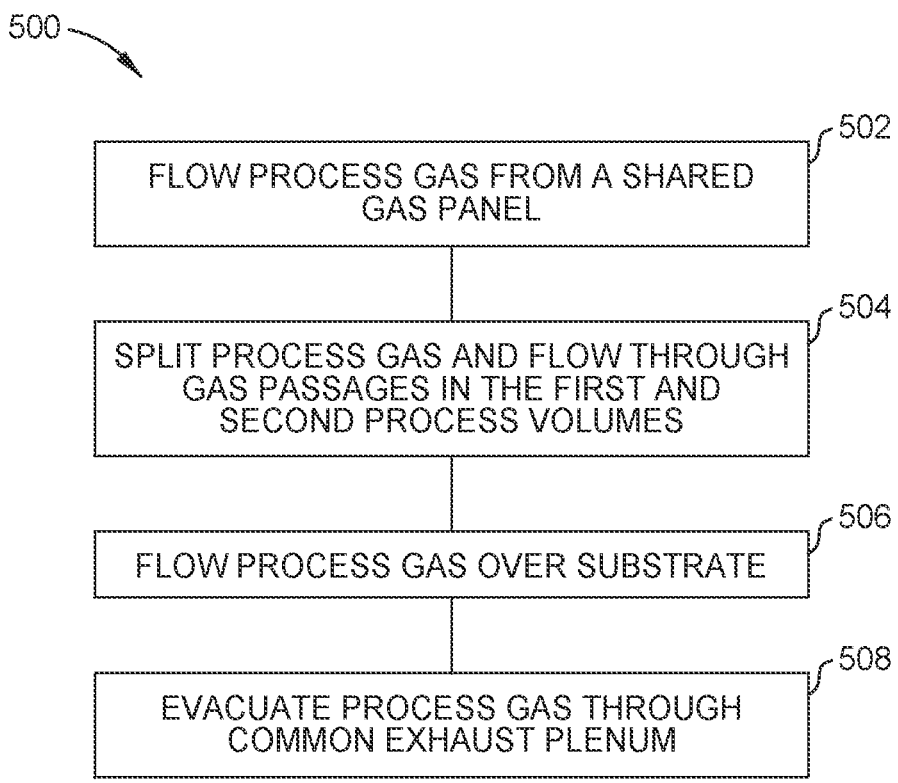
FIG. 5 illustrates operations of a method for processing a substrate according to embodiments described herein.

FIG. 5 illustrates operations of a method 500 for processing a substrate according to embodiments described herein. The method 500 utilizes apparatus described in FIGS. 1-4. The method 500 utilizes one of, or a combination of, a shared gas panel, and a common exhaust plenum.

At operation 502 of the method 500, a process gas is flown from a shared gas panel, such as the gas panel 108. The process gas may be any suitable process gas used in an epitaxial deposition process. The process gas may include group V precursor gases or group III precursor gases. In some embodiments, a mixture of different process gases may be utilized for the operation 502. In some embodiments, the process gas may include, for example, a silicon-containing precursor such as silanes, halogenated silanes, or combinations thereof. Silanes may include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$). Halogenated silanes may include monochlorosilane (MCS), dichlorosilane (DCS), trichlorosilane (TCS), hexachlorodisilane (HCDS), octachlorotrisilane (OCTS), silicon tetrachloride (STC), or a combination thereof. The process gas may alternatively include a germanium-containing precursor. The process gas may further include a precursor gas. The precursor gas may include, for example, phosphorous, boron, arsenic, gallium, or aluminum, depending upon the desired conductive characteristic of the deposited epitaxial layer. The process gas may further include an etchant gas. The etchant gas may include, for example or any gas containing halogen molecules such as hydrogen chloride (HCl), chlorine (Cl), or hydrogen fluoride (HF). The process gas may further include a carrier gas. The carrier gas may include, for example, nitrogen ($N_2$), argon (Ar), helium (He), or hydrogen ($H_2$).

At operation 504 of the method 500, the process gas flown from the gas panel 108 is divided, for example, using a multi-channel flow controller. The process gas is then flown through the first and second gas inject passages 182a, 182b to enter the first and second processing volumes 124, 126. The split process gas is flown at the same rate through both of the first and second gas inject passages 182a, 182b. There may be additional apparatus elements (not shown) along the process gas flow path, such as flow controllers, valves, and pumps. The additional apparatus elements may be disposed between the gas panel 108 and the first and second gas inject passages 182a, 182b. The additional flow control elements may ensure equal distribution of the process gas flow between the first and second processing volumes 124, 126.

At operation 506 of the method 500, process gas is flown over two or more substrates, such as the substrates 155. The two more substrates of operation 506 may be two substrates. The process gas may be delivered over each of the substrate from the first and second gas inject passages 182a, 182b after the operation 504. The flow of the process gas over the substrate enables an epitaxial deposition process to occur.

At operation 508 of the method 500, the process gas is evacuated as exhaust gas through the common exhaust plenum. The common exhaust plenum may be the common exhaust conduit 171 discussed herein. The process gas is evacuated through the first and the second exhaust ports 172a, 172b from the first and second processing volumes 124, 126 before entering the common exhaust conduit 171. After the exhaust gas enters the common exhaust conduit 171, the exhaust gas is removed by the vacuum pump 110 through the exhaust outlet pipe 128.

Figure 6:
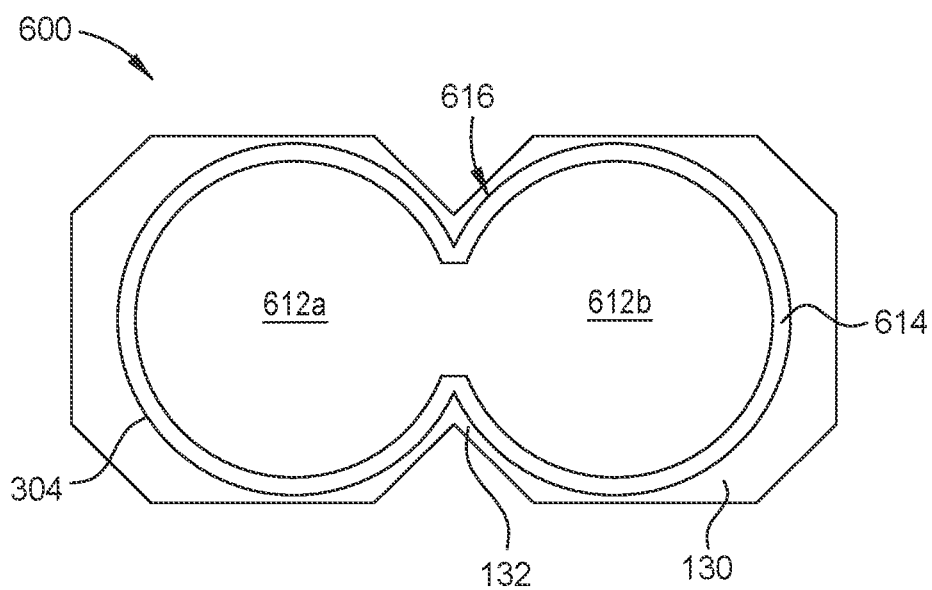
FIG. 6 illustrates a top plan view of a single upper window assembly disposed above the chamber body of both the first processing chamber 101a and the second processing chamber of FIGS. 1-3.

FIG. 6 illustrates a top plan view of a single upper window assembly 600 disposed above the chamber body 130 of both the first processing chamber 101a and the second processing chamber 101b of FIG. 103. The single upper window assembly 600 includes a single upper window 616 and the chamber body 130. The single upper window 616 includes a two inner windows 612a, 612b. The two inner windows 612a, 612b are a first inner window 612a disposed over the first processing volume 124, as shown in FIG. 1, and a second inner window 612b disposed over the second processing volume 126, as shown in FIG. 1. Outer window supports 614 are disposed around the first and the second inner windows 612a, 612b and support the single upper window assembly 600 along a support groove, similar to the support groove 304.

In embodiments in which the single upper window assembly 600 is utilized, a portion of the single upper window 616 is disposed over the middle of the center wall 132. The support groove 304 of the single upper window 616 is shaped similarly to two overlapping ovals or circles, such that the single upper window 616 has an outer profile similar to that of an infinity symbol, the number 8, or a lemniscate. The upper window assembly 600 may be utilized with embodiments shown in FIGS. 1-3 as well as FIGS. 4A-4D.

Although only describing, two processing chambers with shared gas panels and exhaust systems, embodiments disclosed herein may additionally be scaled to include additional processing chambers. In some embodiments, there may be four processing chambers disposed adjacent one another and having a shared chamber body, such as the chamber body 130.

While the foregoing is directed to embodiments of the present disclosure, other and further embodiments of the disclosure may be devised without departing from the basic scope thereof, and the scope thereof is determined by the claims that follow.

What is claimed is:

1. An apparatus for substrate processing, comprising:
   a dual-chamber body, wherein the dual-chamber body comprises:
      a first processing volume on a first side of a central plane;
      a second processing volume on a second side of the central plane;
      an equalization port connecting the first processing volume and the second processing volume;
      a first plurality of gas inject passages formed through an outer surface of a first exterior sidewall of the dual-chamber body and in fluid communication with the first processing volume;
      a second plurality of gas inject passages formed through an outer surface of a second exterior sidewall of the dual-chamber body and in fluid communication with the second processing volume;
      a first exhaust port formed through an outer surface of a third exterior sidewall of the dual-chamber body opposite and across the first processing volume from the first plurality of gas inject passages, the first exhaust port in fluid communication with the first processing volume, wherein a first flow path plane is defined between the first plurality of gas inject passages and the first exhaust port; and
      a second exhaust port formed through an outer surface of a fourth exterior sidewall of through the dual-chamber body opposite and across the second processing volume from the second plurality of gas inject passages, the second exhaust port in fluid communication with the second processing volume, wherein a second flow path plane is defined between the second plurality of gas inject passages and the second exhaust port, and wherein both the first flow path plane and the second flow path plane are at an angle of about 80 degrees to about 100 degrees with respect to a longitudinal axis that extends through both the first processing volume and the second processing volume;
   one or more upper window assemblies disposed over the dual-chamber body;
   a first lower window positioned adjacent the first processing volume;
   a second lower window positioned adjacent the second processing volume
   a first substrate support positioned in the first processing volume;
   a second substrate support positioned in the second processing volume;
   a first lower lamp assembly positioned adjacent the first lower window; and
   a second lower lamp assembly positioned adjacent the second lower window.

2. The apparatus of claim 1, wherein the first plurality of gas inject passages and the first exhaust port are centered along the first flow path plane and the second plurality of gas inject passages and the second exhaust port are centered along the second flow path plane.

3. The apparatus of claim 1, further comprising a shared gas panel fluidly coupled to both the first processing volume and the second processing volume.

4. The apparatus of claim 1, further comprising a shared exhaust fluidly coupled to both the first processing volume and the second processing volume.

5. The apparatus of claim 1, wherein the first plurality of gas inject passages comprise five or more gas inject passages parallel to one another and the second plurality of gas inject passages comprise five or more gas inject passages parallel to one another.

6. The apparatus of claim 1, wherein the first plurality of gas inject passages and the second plurality of gas inject passages are spaced along an inner wall of a first processing chamber and a second processing chamber, respectively.

7. An apparatus for substrate processing, comprising:
   a dual-chamber body, wherein the dual-chamber body comprises:
      a first processing volume formed by a first cavity on a first side of a reference plane;
      a second processing volume formed by a second cavity on a second side of the reference plane;
      an equalization port connecting the first processing volume and the second processing volume;
      a first plurality of gas inject passages formed through an outer surface of a first exterior sidewall of the dual-chamber body and in fluid communication with the first processing volume;
      a second plurality of gas inject passages formed through an outer surface of a second exterior sidewall of the dual-chamber body and in fluid communication with the second processing volume;
      a first exhaust port formed through an outer surface of a third exterior sidewall of the dual-chamber body opposite and across the first processing volume from the first plurality of gas inject passages, the first exhaust port in fluid communication with the first processing volume, wherein a first flow path plane is defined between the first plurality of gas inject passages and the first exhaust port;

a second exhaust port formed through an outer surface of a fourth exterior sidewall of through the dual-chamber body opposite and across the second processing volume from the second plurality of gas inject passages, the second exhaust port in fluid communication with the second processing volume, wherein a second flow path plane is defined between the second plurality of gas inject passages and the second exhaust port, and wherein both the first flow path plane and the second flow path plane are at an angle of about 80 degrees to about 100 degrees with respect to a longitudinal axis that extends through both the first processing volume and the second processing volume;

one or more upper window assemblies disposed over the dual-chamber body;

a first lower window positioned adjacent the first processing volume;

a second lower window positioned adjacent the second processing volume a first substrate support positioned in the first processing volume;

a second substrate support positioned in the second processing volume;

a first lower lamp assembly positioned adjacent the first lower window; and a second lower lamp assembly positioned adjacent the second lower window.

8. The apparatus of claim 7, further comprising a shared gas panel.

9. The apparatus of claim 7, further comprising a shared exhaust.

10. The apparatus of claim 7, wherein the dual-chamber body further comprises an upper groove formed around an outer diameter of each of the first processing volume and the second processing volume.

11. The apparatus of claim 10, wherein the one or more upper window assemblies comprises two upper window assemblies, and each of the two upper window assemblies further comprises:

an inner window; and outer window supports, wherein the outer window supports are at least partially disposed within the upper groove.

12. The apparatus of claim 7, wherein the one or more upper window assemblies comprises a single upper-window.

13. The apparatus of claim 7, wherein the one or more upper window assemblies are disposed between the dual-chamber body and a lid assembly.

14. The apparatus of claim 7, wherein each of the first processing volume and the second processing volume have an inner liner formed therein.

15. A dual-chamber body for substrate processing, comprising:

a chamber body;

a first processing volume formed through the chamber body on a first side of a reference plane;

a second processing volume formed through the chamber body on a second side of the reference plane;

a first plurality of gas inject passages formed through an outer surface of a first exterior sidewall of the dual-chamber body and in fluid communication with the first processing volume;

a second plurality of gas inject passages formed through an outer surface of a second exterior sidewall of the dual-chamber body and in fluid communication with the second processing volume;

a first exhaust port formed through an outer surface of a third exterior sidewall of the dual-chamber body opposite and across the first processing volume from the first plurality of gas inject passages, the first exhaust port in fluid communication with the first processing volume, wherein a first flow path plane is defined between the first plurality of gas inject passages and the first exhaust port;

a second exhaust port formed through an outer surface of a fourth exterior sidewall of through the dual-chamber body opposite and across the second processing volume from the second plurality of gas inject passages, the second exhaust port in fluid communication with the second processing volume, wherein a second flow path plane is defined between the second plurality of gas inject passages and the second exhaust port, and wherein both the first flow path plane and the second flow path plane are at an angle of about 80 degrees to about 100 degrees with respect to a longitudinal axis that extends through both the first processing volume and the second processing volume; and an equalization port connecting the first processing volume and the second processing volume.

16. The dual-chamber body of claim 15, wherein both the first plurality of gas inject passages and the second plurality of gas inject passages comprise five or more gas inject passages parallel to one another.

* * * * *